United States Patent
Kondo (10) Patent No.: US 7,580,437 B2
(45) Date of Patent: Aug. 25, 2009

(54) SURFACE-EMITTING LASER, METHOD FOR MANUFACTURING SURFACE-EMITTING LASER, DEVICE AND ELECTRONIC APPARATUS

(75) Inventor: Takayuki Kondo, Nagano (JP)

(73) Assignee: Seiko Epson Corporation (JP)

( * ) Notice: Subject to any disclaimer, the term of this patent is extended or adjusted under 35 U.S.C. 154(b) by 503 days.

(21) Appl. No.: 11/193,727

(22) Filed: Jul. 29, 2005

(65) Prior Publication Data

US 2006/0083282 A1    Apr. 20, 2006

(30) Foreign Application Priority Data

Oct. 15, 2004    (JP)    ............... 2004-301565

(51) Int. Cl.
*H01S 5/00*    (2006.01)

(52) U.S. Cl. ............... 372/50.23; 372/50.124

(58) Field of Classification Search .............. 372/50.23, 372/50.1, 50.124

See application file for complete search history.

(56) References Cited

U.S. PATENT DOCUMENTS

| | | | |
|---|---|---|---|
| 5,426,657 A | 6/1995 | Vakhshoori | |
| 5,838,715 A | 11/1998 | Corzine | |
| 6,661,829 B2 | 12/2003 | Jeon | |
| 7,352,787 B2 * | 4/2008 | Mukoyama et al. | 372/43.01 |
| 2003/0091084 A1 * | 5/2003 | Sun et al. | 372/50 |

FOREIGN PATENT DOCUMENTS

| | | |
|---|---|---|
| JP | 6-326417 | 11/1994 |
| JP | 11-233888 | 8/1999 |
| JP | 2000-076682 | 3/2000 |
| JP | 2002-214404 | 7/2002 |
| JP | 2003-121611 | 4/2003 |
| JP | 2005-150505 | 6/2005 |

* cited by examiner

*Primary Examiner*—Armando Rodriguez
(74) *Attorney, Agent, or Firm*—Harness, Dickey & Pierce, P.L.C.

(57) ABSTRACT

Surface-emitting lasers are provided that can readily make highly accurate dimensions at the center axis of a resonator. A surface-emitting laser is characterized in that a lens layer in a convex lens shape having an apex portion that is flat is disposed on one end portion of a resonator.

6 Claims, 9 Drawing Sheets

WAVELENGTH

SURFACE-EMITTING LASER, METHOD FOR MANUFACTURING SURFACE-EMITTING LASER, DEVICE AND ELECTRONIC APPARATUS

RELATED APPLICATIONS

This application claims priority to Japanese Patent Application No. 2004-301565 filed Oct. 15, 2004, which is hereby expressly incorporated by reference herein in its entirety.

BACKGROUND

1. Technical Field

The present invention relates to surface-emitting lasers, methods for manufacturing surface-emitting lasers, devices and electronic apparatuses.

2. Related Art

Semiconductor lasers include edge-emitting lasers that emit a laser light at an edge of a semiconductor substrate, and surface-emitting lasers that emit a laser light from a surface of a semiconductor substrate. Surface-emitting lasers are characterized in that the laser emission angle is isotropic and small compared to edge-emitting lasers. When a surface-emitting laser is used as a light source for optical communications, for example, a large optical output is required. In order to increase the output of a surface-emitting laser, an enlargement of its laser emission aperture is effective. However, when the laser emission aperture is enlarged, the laser emission angle becomes larger. When the laser emission angle becomes larger, and for example, when the surface-emitting laser and an optical fiber are directly, optically coupled without a lens or the like, the optical coupling efficiency is lowered, and their mounting margin is reduced.

According to a conventional method to compose a smaller laser emission angle of a surface-emitting laser, an upper surface of a columnar section composing a resonator of the surface-emitting laser is formed into a convex lens shape (lens layer or contact layer). An emitted light of the surface-emitting laser is converged by the lens layer or the contact layer, whereby the laser emission angle becomes smaller (for example, see FIG. 1, FIG. 7, and FIG. 8 of Japanese Laid-open Patent Application 2000-76682).

However, it should be noted that, in the actual surface-emitting laser, the lens layer also functions as a part of the resonator (an upper DBR: distributed reflection type multi-layer mirror). By this, the index of reflection of the upper DBR considerably changes depending on the thickness of the lens layer. In particular, when the index of reflection in an area adjacent to the center axis of the columnar section composing the resonator lowers, demerits on basic characteristics such as the threshold value, slope efficiency and the like become greater than the merit of beam reshaping (convergence) by the lens layer. Sometimes, laser oscillation itself would not occur.

The present invention has been made in view of the above circumstances, and its object is to provide surface-emitting lasers in which highly accurate dimensions can be readily made at the center axis of a resonator, methods for manufacturing the surface-emitting lasers, devices and electronic apparatuses.

Also, it is an object of the present invention to provide surface-emitting lasers wherein a desired index of reflection can be excellently obtained at the center axis of a resonator, methods for manufacturing the surface-emitting lasers, devices and electronic apparatuses.

Moreover, it is an object of the present invention to provide surface-emitting lasers that can reduce the laser emission angle, methods for manufacturing the surface-emitting lasers, devices and electronic apparatuses.

SUMMARY

To achieve the objects described above, a surface-emitting laser in accordance with the present invention is characterized in that a lens layer in a convex lens shape having an apex portion that is flat is disposed on one end portion of a resonator (for example, an upper surface of the resonator) of the surface-emitting laser.

According to the present invention, the dimension of the resonator in the surface-emitting laser at its center axis is defined by a length from a lower surface to an upper surface (the apex portion of the lens layer) of the resonator. It is noted here that, to form the upper surface of the resonator in a convex lens shape, the upper surface needs a processing such as etching to be conducted. It is generally difficult to accurately obtain desired dimensions by etching. However, in accordance with the present invention, the apex portion of the lens layer is flat, such that the apex portion does not need a processing such as etching or the like. Accordingly, the present invention can readily provide a highly accurate dimension (length) at the center axis of the resonator.

By this, the present invention can readily make the index of reflection at the center axis of the resonator, which is most important for the surface-emitting laser to exhibit its functions, to a desired value. Accordingly, with the surface-emitting laser in accordance with the present invention, the basic laser characteristics such as the threshold value, efficiency and the like can be readily and excellently obtained.

Also, in accordance with the present invention, light emitted from portions of the resonator removed from its center axis can be refracted by a curved portion of the lens layer (a convex lens shaped portion). Therefore, in accordance with the present invention, a sufficient beam reshaping effect as a whole can be obtained, and the laser emission angle can be sufficiently reduced. It is noted that the lens layer may be disposed at a lower surface of the resonator.

Also, in the surface-emitting laser in accordance with the present invention, the lens layer may preferably be formed from semiconductor.

According to the present invention, the lens layer is formed from semiconductor, and therefore the film thickness of the semiconductor can be accurately and readily controlled. Also, the refractive index of laser light in the lens layer can be made greater. Accordingly, by the surface-emitting laser of the present invention, the basic laser characteristics such as the threshold value and efficiency can be more excellently and readily obtained. Also, according to the present invention, the laser emission angle can be further reduced.

Also, the surface-emitting laser in accordance with the present invention may preferably have a current constricting layer (oxidation constricting layer) that defines a flow area of a current that flows within the resonator, wherein the flat area of the lens layer may preferably have a diameter smaller than a diameter of the current flow area (oxidation constricting diameter) of the current constricting layer.

According to the present invention, the current can be locally circulated in the resonator by the current constricting layer. For this reason, the operation current can be reduced, and a stronger light output can be obtained. Also, in accordance with the present invention, the flat area of the lens layer is made smaller than the current flow area in the current constricting layer. By this, according to the present invention, the basic laser characteristics can be even more excellently and readily obtained, and the laser emission angle can be further reduced.

A surface-emitting laser in accordance with the present invention is characterized in that a bottom surface of the convex lens shape of the lens layer may preferably be smaller than an upper surface of the resonator.

According to the present invention, the lens shaped portion is provided on a part of the upper surface of the resonator. By this, the convex lens shape can be provided with a small curvature. Further, the convex lens shape can be made thinner. Accordingly, the present invention can readily provide a surface-emitting laser with higher performance.

Also, in the surface-emitting laser in accordance with the present invention, a dielectric film (embedding layer) may preferably be arranged around the columnar section that forms at least a part of the resonator.

In accordance with the present invention, for example, short-circuit of an electrode (for example, an upper electrode) disposed on the emission surface of the resonator with another semiconductor portion can be avoided by the dielectric film. Also, a step difference between the upper surface and the side surface of the columnar section of the resonator can be eliminated by the dielectric film. By this, the electrode that connects to the contact layer can be formed on a smooth plane surface or curved surface without steps, and such an electrode can be excellently and readily formed. It is noted that the dielectric film can be composed of, for example, polyimide.

To achieve the objects described above, a device in accordance with the present invention is characterized in comprising the surface-emitting laser described above.

In accordance with the present invention, there can be provided a device equipped with a surface-emitting laser that has excellent basic laser characteristics such as the threshold value and efficiency, and can sufficiently reduce the laser emission angle.

To achieve the objects described above, a method for manufacturing a surface-emitting laser in accordance with the present invention is characterized in comprising: forming at least a plurality of semiconductor layers on a semiconductor substrate to form a semiconductor laminated body that is a component of a resonator; forming a resist layer having a predetermined pattern on the semiconductor laminated body; forming a columnar section that becomes a part of the resonator and bringing an upper surface of the columnar section in a lens shape including the lens layer in relief by conducting an etching treatment using the resist layer as a mask; and removing the resist layer remaining on the apex portion of the lens shape.

According to the present invention, the apex portion of the lens shape (in other words, the portion adjacent to the center axis of the lens layer) is not etched. By this, the original designed film thickness defining the dimension of the resonator at its center axis can be retained. Accordingly, the index of reflection at the center axis of the resonator, which is most important for the surface-emitting laser, can be readily set to a desired value. Therefore, according to the present invention, a surface-emitting laser that exhibits basic laser characteristics such as the threshold value, efficiency and the like to a high degree can be excellently and readily manufactured.

Also, in accordance with the present invention, light emitted from portions of the resonator removed from its center axis can be refracted by the lens shaped portion. Therefore, in accordance with the present invention, a surface-emitting laser that can provide a sufficient beam reshaping effect as a whole, and has a sufficiently small laser emission angle can be excellently and readily manufactured.

Also, the step of forming the semiconductor laminated body in accordance with the present invention may preferably include a step of forming a lower DBR layer on the semiconductor substrate, a step of forming an active layer on the lower DBR layer, and a step of forming an upper DBR layer on the active layer.

Also, in the method for manufacturing a surface-emitting laser in accordance with the present invention, the resist layer may preferably be reshaped in a lens shape before the etching treatment is conducted.

According to the present invention, by concurrently etching the resist layer in a lens shape and the semiconductor laminated body, the lens shape composed of the resist layer and a part of the semiconductor laminated body can be formed. Then, by removing the resist layer, the lens layer in a convex lens shape having a flat apex portion can be arranged on one end portion (for example, a light emission surface) of the resonator of the surface-emitting laser.

Also, in accordance with the present invention, the resist layer and the semiconductor laminated body can be isotropically reduced in the etching treatment. Accordingly, the center axis of the columnar section composing the resonator (optical axis of laser) and the optical axis of the lens shape can coincide with each other in a self-alignment manner, such that a surface-emitting laser with high performance can readily be manufactured.

Also, in the method for manufacturing a surface-emitting laser in accordance with the present invention, the etching treatment may preferably include dry etching with a high selection ratio that hardly etches the resist layer but etches the semiconductor laminated body, and dry etching with a low selection ratio that etches the resist layer and the semiconductor laminated body (generally at the same ratio) at the same time.

The dry etching with a high selection ratio may preferably be conducted by using the resist layer as a mask for forming the columnar section. By the dry etching with a high selection ratio, while leaving the resist layer remained almost as it is, the columnar section (a part of the resonator) with a large side surface angle can be formed.

The dry etching with a low selection ratio may preferably be conducted until the outer diameter of the resist layer becomes a specified size. By the dry etching with a low selection ratio, the resist layer and the semiconductor laminated body (such as the columnar section) can be etched at the same time. Accordingly, the upper surface of the columnar section including the resist layer can be formed in a lens shape in relief. Then, by removing the remaining resist layer, the convex lens shape (lens layer) having a flat apex portion can be arranged on one end portion (light emission surface) of the columnar section.

Also, in the method for manufacturing a surface-emitting laser in accordance with the present invention, the outer diameter of the resist layer may preferably be measured during or at the completion of the dry etching with a low selection ratio.

According to the present invention, by measuring the outer diameter of the resist layer, the film thickness of the resist layer can be readily and highly accurately grasped. Therefore, a surface-emitting laser with high performance can be more readily manufactured.

Also, in the method for manufacturing a surface-emitting laser in accordance with the present invention, according to the outer diameter of the resist layer measured, the time for the dry etching with a low selection ratio to be conducted thereafter may preferably be adjusted.

According to the present invention, the dry etching step can be readily and highly accurately managed.

Also, in the method for manufacturing a surface-emitting laser in accordance with the present invention, a current constricting layer that defines a flow area of a current that flows within the columnar section may preferably be formed, wherein the diameter of the flow area may preferably be made greater than a diameter of the flat area of the lens shape that is formed by removing the resist layer.

According to the present invention, the flat area of the lens layer is smaller than the current flow area at the current constricting layer, such that a surface-emitting laser with a high degree of basic laser characteristics such as the threshold value and efficiency and a small laser emission angle can be manufactured.

Also, in the method for manufacturing a surface-emitting laser in accordance with the present invention, the etching treatment may preferably include a treatment to isotropically reduce the resist layer such that the outer diameter of the resist layer becomes smaller than the outer diameter of the upper surface of the columnar section, and an electrode in a ring shape may preferably be formed in the flat area of the columnar section.

According to the present invention, the electrode in a ring shape is formed on the flat area of the columnar section, such that the electrode and a contact layer of the surface-emitting laser can have a large contact area. Therefore, according to the present invention, the device resistance of a surface-emitting laser can be readily reduced, and a surface-emitting laser with high performance can be readily provided.

To achieve the objects described above, an electronic apparatus in accordance with the present invention is characterized in comprising the surface-emitting laser described above or the device described above.

According to the present invention, there can be provided an electronic apparatus equipped with a surface-emitting laser that has excellent basic laser characteristics such as the threshold value and efficiency, and can sufficiently reduce the leaser emission angle.

DETAILED DESCRIPTION

Surface-emitting lasers in accordance with embodiments of the present invention are described below with reference to the accompanying drawings.

FIRST EMBODIMENT

Figure 1:
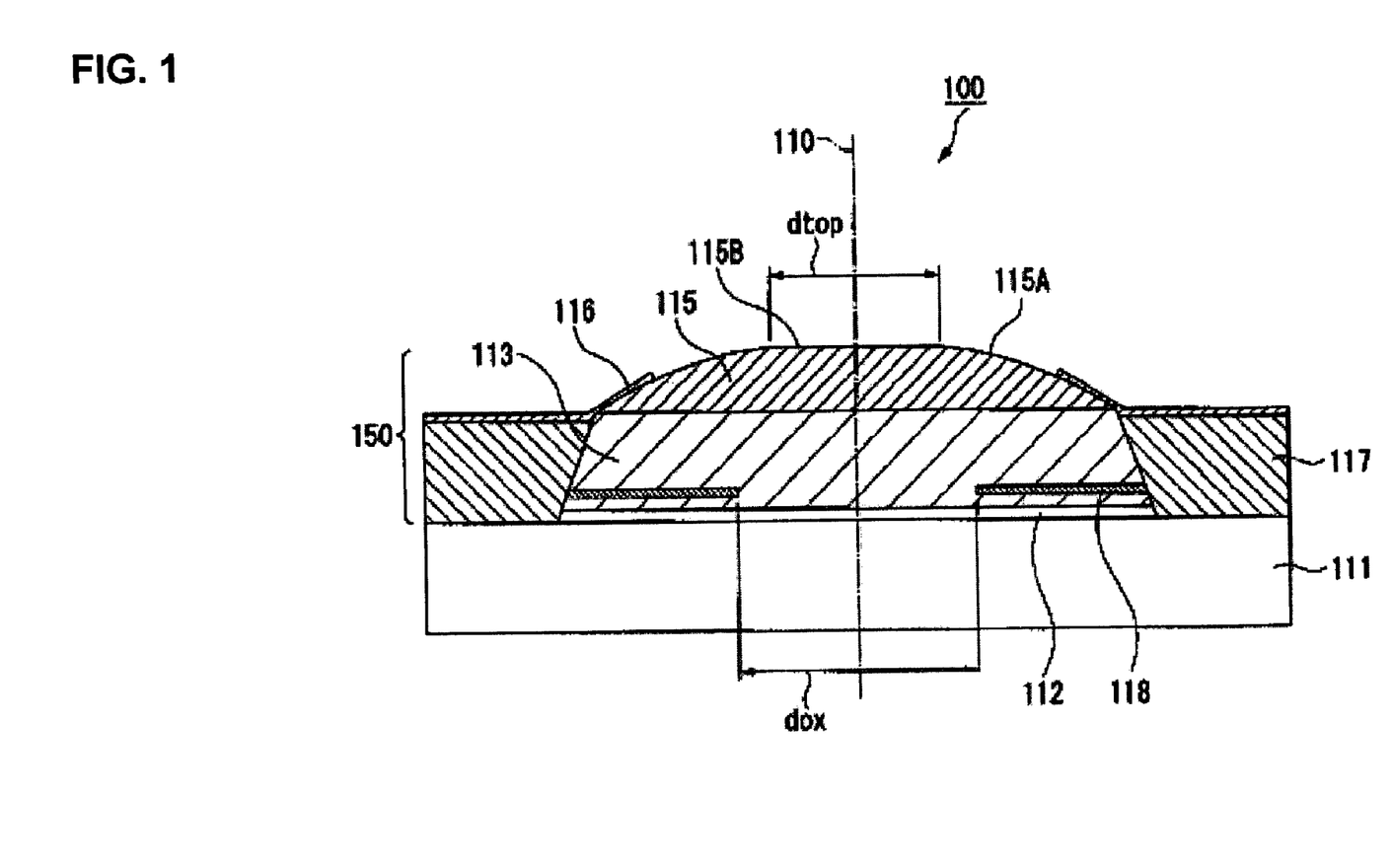
FIG. 1 is a schematic cross-sectional view of a surface-emitting laser in accordance with a first embodiment of the present invention.

FIG. 1 is a schematic cross-sectional view showing an example of a surface-emitting laser in accordance with a first embodiment of the present invention. The surface-emitting laser 100 shown in FIG. 1 is formed from a lower DBR 111, an active layer 112, an upper DBR 113, a lens layer 115, an upper electrode 116, an embedding layer 117, and an oxidation constricting layer (current constricting layer) 118.

The lower DBR 111 is provided on, for example, an n-type GaAs substrate (not shown). The lower DBR 111 forms a distributed reflection type multilayer mirror (DBR mirror) of 25 pairs of alternately laminated, for example, "GaAs" and "$Al_{0.9}Ga_{0.1}As$" layers. The active layer 112 is provided on the lower DBR 111. The active layer 112 is formed from, for example, InGaAs well layers having a thickness of 3 nm and $Al_{0.3}Ga_{0.7}As$ barrier layers having a thickness of 3 nm in which the well layers form a quantum well active layer composed of three layers.

The upper DBR 113 is provided on the active layer 112. The upper DBR 113 forms a distributed reflection type multilayer mirror (DBR mirror) of 30 pairs of alternately laminated, for example, "GaAs" and "$Al_{0.9}Ga_{0.1}As$" layers.

The lower DBR 111 is formed to be n-type semiconductor by doping Si. The upper DBR 113 is formed to be p-type semiconductor by doping C. The active layer 112 is not doped with an impurity. Accordingly, the lower DBR 111, the active layer 112 and the upper DBR 113 form a pin diode, thereby composing a resonator of the surface-emitting laser. The active layer 112 and the upper DBR 113 in the resonator compose a columnar section 150 formed in a convex shape over an upper surface of the lower DBR 111 and the semiconductor substrate. It is noted that the lower DBR 111 may also be formed in a convex shape, and a portion of the lower DBR 11 adjacent to its upper surface can be a part of the columnar section 150. The upper surface and the lower surface of the columnar section 150 define emission surfaces of a laser light of the surface-emitting laser 100.

The oxidation constricting film 118 is arranged in the upper DBR 113 adjacent to its lower surface. The oxidation constricting film 118 has a plane configuration in a ring shape. The center of the ring shape is arranged on the center axis 110. The oxidation constricting film 118 is formed from a dielectric layer mainly composed of, for example, Al oxide. Then, the oxidation constricting film 118 defines a flow area of a current that flows in the resonator of the surface-emitting laser 100. Accordingly, the oxidation constricting film 118 acts to reduce the area of the active region that emits light, lower the threshold current, and narrow the beam width. An oxidation constricting aperture of the oxidation constricting film 118, in other words, a flow area where a current flows, has a diameter $d_{OX}$.

The lens shaped section 115, which is one of the characteristic compositions of the present embodiment, is provided on one end section (an upper surface) of the upper DBR 113. Therefore, the lens layer 115 is provided on one end portion (light emission surface) of the surface-emitting laser 100.

Also, the lens layer 115 functions as a part of the upper DBR 113, and composes a part of the columnar section 150. The lens layer 115 is formed from semiconductor, and P-type GaAs is used in the present embodiment. Besides this, AlGaAs can also be used.

Furthermore, the lens layer 115 is formed in a convex lens shape having a flat apex portion, as shown in FIG. 1. In other words, the lens layer 115 includes a curved surface portion 115A defining a convex lens, and a flat apex portion 115B. The center of the apex portion 115B is disposed on the center axis 110 of the surface-emitting laser 100. Further, the plane configuration of the apex portion 115B is in a circular shape, and the plane configuration of the curved surface portion 115A is in a ring shape. The flat apex portion 115 has a size with a diameter being $d_{top}$. It is noted that the apex portion 115 may preferably be as small as possible, and may preferably have a relation of "Diameter $d_{top}$<Diameter $d_{OX}$."

The embedding layer (dielectric film) 117 is disposed to cover side surfaces of the active layer 112 and the upper DBR 113 and an upper surface of the lower DBR 111. The embedding layer 117 may be formed from polyimide resin, benzocyclobutene (BCB), silicon modified polyimide resin, epoxy resin, silicon modified epoxy resin, acrylic resin, phenol resin, polybenzoxazole (PBO) or the like.

The upper electrode 116 is in a ring shape, and is disposed on an area adjacent to the outer circumference of the lens layer 115 and on the embedding layer 117. Further, the upper electrode 116 is in ohmic contact with the lens layer 115. Also, the surface-emitting laser 100 is equipped with a lower electrode (not shown) that is in ohmic contact with the lower DBR 111. The lower electrode is provided, for example, over the entire bottom surface of the lower DBR 111.

A voltage is applied across the upper electrode 116 and the lower electrode in the surface-emitting laser 100 thus structured, such that a potential in a forward direction is impressed to the pin diode. Then, recombinations of electrons and holes occur in the active layer 112, thereby causing emission of light due to the recombinations. Stimulated emission occurs during the period the generated light reciprocates between the upper DBR 113 and the lower DBR 111 through the oxidation constricting aperture of the oxidation constricting film 118, whereby the light intensity is amplified. When the optical gain exceeds the optical loss, laser oscillation occurs, whereby a laser light is emitted from an aperture section of the upper electrode 116 in a direction orthogonal to the substrate. The laser light is refracted as it passes through the lens shaped section 115, whereby the laser emission angle is narrowed.

In view of the above, according to the surface-emitting laser 100 of the present embodiment, the lens layer 115 has the apex portion 115B that is flat, such that the thickness of the lens layer 115 along the center axis 110 can be highly accurately set to a desired value. By this, in the surface-emitting laser 100, its dimension at the center axis 110 of the resonator can be highly accurately set to a desired value. In other words, the dimension of the surface-emitting laser 100 at the center axis 110 of the resonator is defined by the length from the bottom surface of the lower DBR 111 to the apex portion 115B of the lens layer 115. Further, because the apex portion 115B is flat, a processing treatment such as etching does not need to be conducted. Accordingly, in the surface-emitting laser 100 in accordance with the present embodiment, a highly accurate dimension (length) can be readily provided at the center axis 110 of the resonator.

Accordingly, in the surface-emitting laser 100 in accordance with the present embodiment, the index of reflection at the center axis 110 of the resonator, which is most important for the surface-emitting laser to exhibit its functions, can be highly accurately set to a desired value. Accordingly, with the surface-emitting laser 100, the basic laser characteristics such as the threshold value, efficiency and the like can be readily and excellently obtained.

Also, in the surface-emitting laser 100, light emitted from portions of the resonator removed from its center axis 110 can be refracted by the curved surface portion 115A of the lens layer 115. Therefore, with the surface-emitting laser 100, a sufficient beam reshaping effect as a whole can be obtained, and the laser emission angle can be sufficiently reduced.

Also, in the surface-emitting laser 100, the lens layer 115 is formed from semiconductor, and therefore the film thickness of the semiconductor can be accurately and readily controlled. Also, by forming the lens layer 115 from semiconductor, the refractive index of laser light in the lens layer 115 can be made greater. Accordingly, by the surface-emitting laser 100, the basic laser characteristics such as the threshold value and efficiency can be more excellently and readily obtained, and the laser emission angle can be further reduced.

Also, by forming the lens layer 115 and the oxidation constricting film 118 in the surface-emitting laser 100 such that the relation "Diameter $d_{top}$<Diameter $d_{OX}$" is established. This can further assure even better basic laser characteristics, and a smaller laser emission angle.

Figure 2:
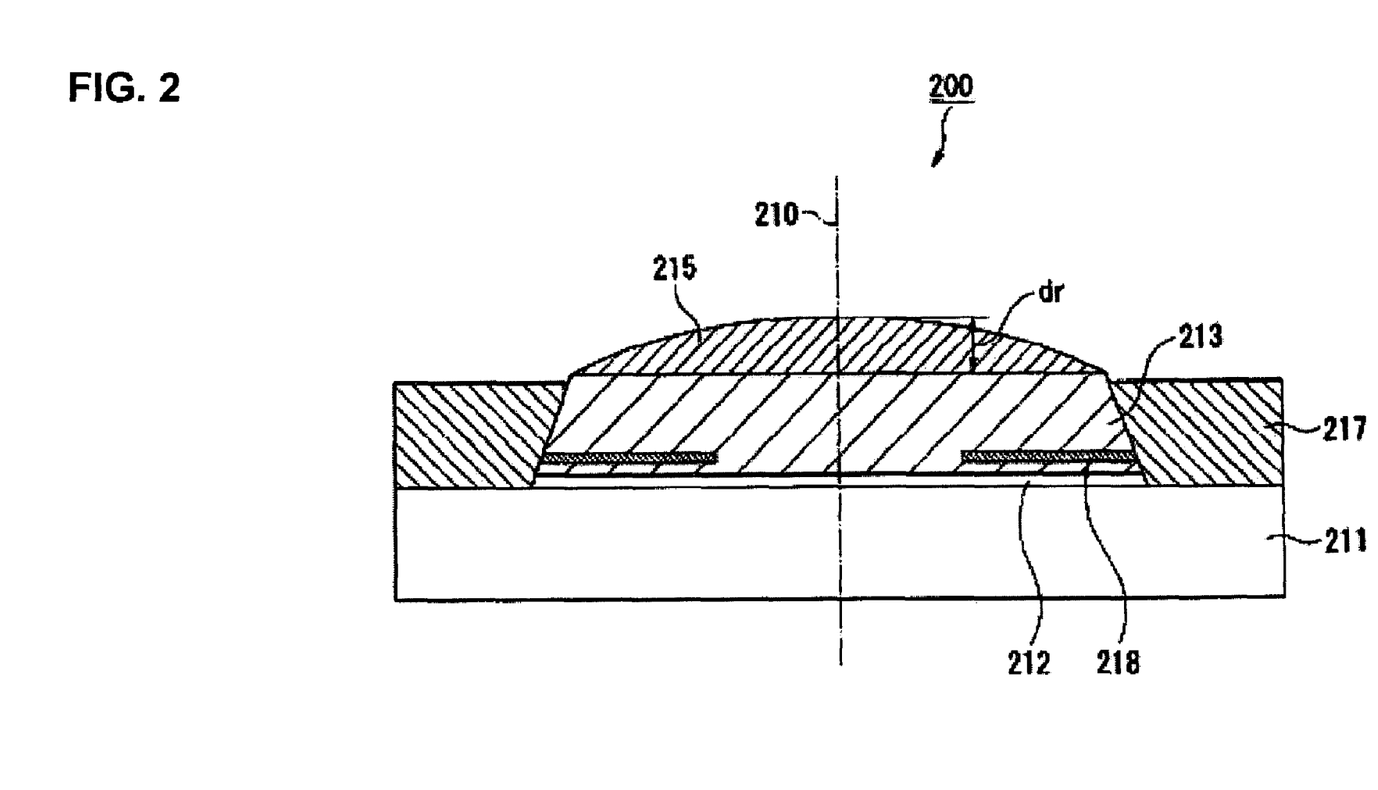
FIG. 2 is a schematic cross-sectional view of an example of a surface-emitting laser without a flat area at an apex of its lens layer.

FIG. 2 is a schematic cross-sectional view of an example of a surface-emitting laser that does not have a flat area at an apex portion of a lens layer. Referring to FIG. 2, the effects of the surface-emitting laser 100 in accordance with the embodiment described above are concretely described.

A main difference between the surface-emitting laser 200 shown in FIG. 2 and the surface-emitting laser 100 is that a lens layer 215 is in a convex lens shape with its entire upper surface being in a curved surface and does not have a flat portion that corresponds to the apex portion 115B.

The surface-emitting laser 200 is formed from a lower DBR 211, an active layer 212, an upper DBR 213, a lens layer 215, an upper electrode (not shown), an embedding layer 217, and an oxidation constricting layer 218. It is noted here that the lower DBR 211 corresponds to the lower DBR 111. The active layer 212 corresponds to the active layer 112. The upper DBR 213 corresponds to the upper DBR 113. The upper electrode corresponds to the upper electrode 116. The embedding layer 217 corresponds to the embedding layer 117.

For example, the designed oscillation wavelength of the surface-emitting laser 200 is 980 nm. Also, the uppermost surface of the upper DBR 213 is composed of a layer with a high refractive index of ¼λ. The lens layer 215 is formed from GaAs semiconductor on the upper DBR 213.

The surface-emitting laser 200 having the structure described above is referred to as a surface-emitting laser A when the thickness dr at the center axis of the lens layer 215 is 552 nm, and a surface-emitting laser B when the thickness dr is 483 nm. The indexes of reflection at the upper DBR 213 are compared between the two surface-emitting lasers A and B. The indexes of reflection are assumed to be values at the center axis 210. The results of comparison of the indexes of reflection are shown in Table 1 below.

TABLE 1

| Surface-emitting laser | Lens layer thickness | Index of reflection of upper DBR |
|---|---|---|
| A | 552 nm (an integral multiple of ½ λ) | 99.85% |

TABLE 1-continued

| Surface-emitting laser | Lens layer thickness | Index of reflection of upper DBR |
|---|---|---|
| B | 483 nm (an integral multiple of ½ λ + ¼ λ) | 98.2% |

Figure 3:
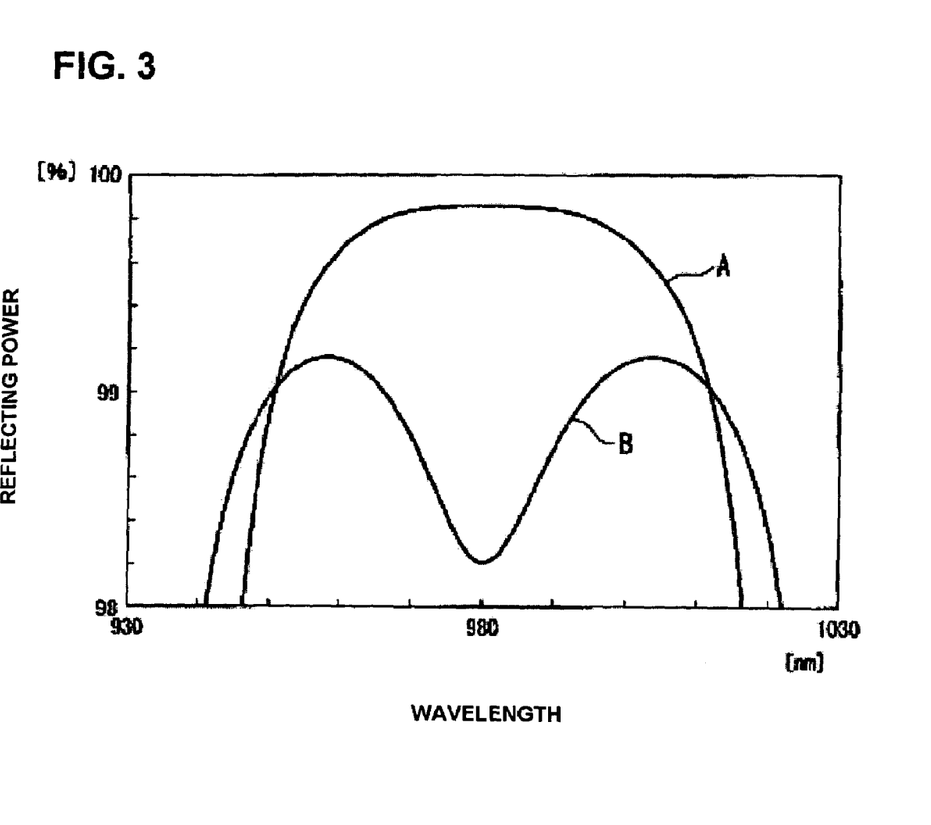
FIG. 3 is a graph showing the relation between indexes of reflection and oscillation wavelengths in surface-emitting lasers.

FIG. 3 is a graph showing the relation between indexes of reflection and oscillation wavelengths concerning the surface-emitting lasers A and B. The indexes of reflection at the center axis 210 are indicated along the axis of ordinates, and the oscillation wavelengths are shown along the axis of abscissa. Then, a curve A indicates characteristics of the surface-emitting laser A, and a curve B indicates characteristics of the surface-emitting laser B.

As indicated in Table 1 above and in FIG. 3, the surface-emitting laser B with a low index of reflection proved that even a laser oscillation was difficult. In this manner, a thickness difference of mere 69 nm in the lens layer 215 leads to a serious defect.

For example, according to the method for manufacturing a surface-emitting laser recited in Patent Document 1 described above, dry etching with a low selection conduction is conducted by using a resist mask in a lens shape, thereby forming the lens layer in a lens shape. However, it is not easy with the dry etching to control the remaining thickness of the lens layer with a precision level on the order of several ten nm. Also, when the lens layer is formed in a lens shape by wet etching, the control of the thickness of the lens layer becomes almost impossible.

On the other hand, with the surface-emitting laser 100 in accordance with the present embodiment shown in FIG. 1, the lens layer 115 has the apex portion 115B that is flat, and a forming process such as an etching treatment does not need to be conducted for the apex portion 115B. Therefore, the film thickness of the lens layer 115 at the center axis 110 in the surface-emitting laser 100 is maintained to be the film thickness before the lens processing. Accordingly, with the surface-emitting laser 100, the thickness of the lens layer 115 at the center axis 110 can be highly accurately formed to a desired value, compared to a conventional surface-emitting laser with a lens layer, and therefore a high performance surface-emitting laser can be provided.

In the present embodiment example, the upper DBR is p-type and the lower DBR is n-type, but they can be inverted.

Manufacturing Method

Next, a method for manufacturing the surface-emitting laser 100 having the structure described above is described with reference to FIG. 4 and FIG. 5.

First Step

Figure 4:
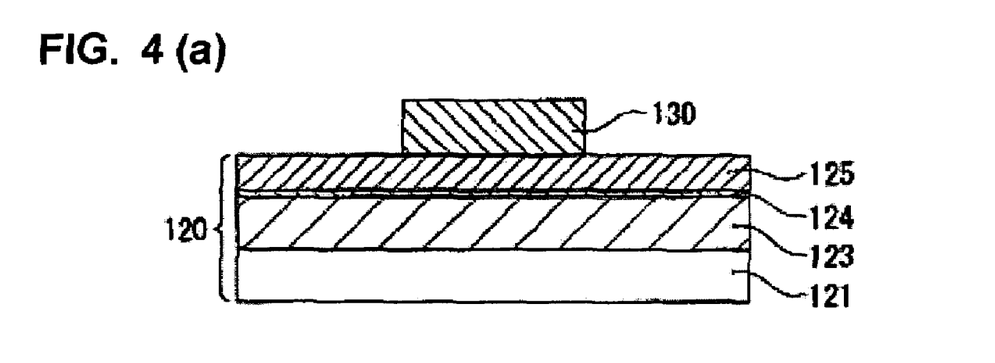
FIGS. 4(a)-(d) are cross-sectional views indicating a method for manufacturing a surface-emitting laser in accordance with a first embodiment of the present invention.

FIG. 4 (a) is a schematic cross-sectional view showing a first step in the present manufacturing method. First, a lower DBR layer 121 composed of 25 pairs of alternately laminated $Al_{0.15}Ga_{0.85}As$ and AlAs layers and doped with Se is formed on, for example, an n-type GaAs substrate (not shown). The lower DBR layer 121 corresponds to the lower DBR 111 in FIG. 1. Next, on the lower DBR layer 121 is formed an active layer (not shown) composed of GaAs well layers having a thickness of 3 nm and $Al_{0.3}Ga_{0.7}As$ barrier layers having a thickness of 3 nm in which the well layers are composed of three layers. The active layer is a source of the active layer 112 in FIG. 1. Further, on the active layer, an upper DBR layer 123 composed of 30 pairs of alternately laminated $Al_{0.15}Ga_{0.85}As$ and $Al_{0.9}Ga_{0.1}As$ layers and doped with Zn is formed. The upper DBR layer 123 is a source of the upper DBR 113 in FIG. 1. Then, a contact layer 124 composed of $Al_{0.15}Ga_{0.85}As$ is laminated on the upper DBR layer 123. This contact layer 124 may not be formed. Then, a lens layer 125 is formed on the contact layer 124. The lens layer 125 may be composed of semiconductor having a bandgap greater than a bandgap corresponding to the energy of a laser light of the surface-emitting laser 100. The lens layer 125 is a source of the lens layer 115 in FIG. 1.

Epitaxial layers 120 composed of the lower DBR layer 121, the active layer, the upper DBR layer 123, the contact layer 124 and the lens layer 125 can be epitaxially grown by a metal organic vapor phase growth (MOVPE: Metal-Organic Vapor Phase Epitaxy) method. In this instance, for example, the growth temperature may be 750° C., the growth pressure may be $2 \times 10^4$ Pa, organic metals such as TMGa (trimethyl gallium) and TMAl (trimethyl aluminum) may be used as III-group material, $AsH_3$ may be used as V-group material, $H_2Se$ may be used as n-type dopant, and DEZn (dimethyl zinc) may be used as p-type dopant. The epitaxial layers 120 compose a semiconductor laminated body that is a component of a resonator of the surface-emitting laser.

Next, a photoresist is coated on the lens layer 125, and then the photoresist is patterned by photolithography. By this, a resist layer 130 having a predetermined pattern is formed, as shown in FIG. 4 (a).

Second Step

FIG. 4 (b) is a schematic cross-sectional view showing a second step of the present manufacturing method. In this step, the resist layer 130 is formed into a convex lens shape. Concretely, the resist layer 130 is heated and re-flowed, in other words, melted resist is flowed and re-formed. By this, the resist layer 130 is influenced by surface tension and is transformed into a convex lens shape shown in FIG. 4 (b). The heating method can be conducted by using, for example, a hot plate, a heated air circulation type oven or the like. Conditions when a hot plate is used may differ depending on the material quality of the resist, and may be 2-10 minutes, and more preferably be 5 minutes at 150° C. or higher. Also, in the case of a heated air circulation type oven, it may preferably be 20-30 minutes at 160° C. or higher. It is noted that the resist layer 130 may be formed into a convex lens shape by using a gray mask, without heating.

Third Step

FIG. 4 (c) is a schematic cross-sectional view showing a third step of the present manufacturing method. In this step, as shown in FIG. 4 (c), a columnar section 151 composed of the upper DBR layer 123, the contact layer 124 and the lens layer 125 is formed. The columnar section 151 defines a part of the resonator. It is noted that a part of the lower DBR 121 and the active layer may define a part of the columnar section 151. To form the columnar section 151, the resist layer 130 in a convex lens shape is used as a mask, and dry-etching with a high selection ratio is conducted. In other words, while the resist layer 130 is almost entirely left as it is, the lens layer 125, the contact layer 124, the upper DBR 123, the active layer and up to an upper portion of the lower DBR 121 are etched in a mesa shape, thereby forming the columnar section 151. The selection ratio at this etching may preferably be 2.0 or greater, for example. By this step, the columnar section 151 having a great side surface angle can be formed.

Fourth Step

FIG. 4 (d) is a schematic cross-sectional view showing a fourth step of the present manufacturing method. In this step, the columnar section 151 and the resist layer 130 are isotropically reduced. Concretely, dry etching with a low selection ratio condition is conducted. By so doing, the columnar section 151 and the resist layer 130 are etched concurrently. By this, the lens shape of the resist layer 130 is formed in relief on the upper surface of the columnar section 151, whereby a columnar section 152 having a lens shape on its upper surface (one end portion) is formed.

The dry etching in the present step is conducted until the diameter (outer diameter) $d_{top}$ of the resist layer 130 becomes to be a predetermined value. For example, the diameter $d_{top}$ of the resist layer 130 may be successively measured, and the dry etching in the present step may be stopped when the diameter $d_{top}$ reaches the predetermined value. By so doing, the film thickness of the resist layer 130 can be readily and highly accurately controlled. Also, by controlling the film thickness of the resist layer 130 with a high degree of accuracy, the diameter $d_{top}$ of a flat apex portion 125B to be formed in a later step can be highly accurately controlled.

Also, in the present step, according to the measured values of the diameter $d_{top}$ of the resist layer 130, the time for dry etching to be conducted thereafter may be adjusted. By so doing, the dry etching treatment of the present step can also be readily and highly accurately managed. The diameter $d_{top}$ of the resist layer 130 may preferably be as small as possible. Further, the diameter $d_{top}$ of the resist layer 130 may preferably be smaller than the diameter $d_{OX}$ of an oxidation constricting aperture of an oxidation constricting film 128 to be formed in a later step.

Fifth Step

Figure 5:
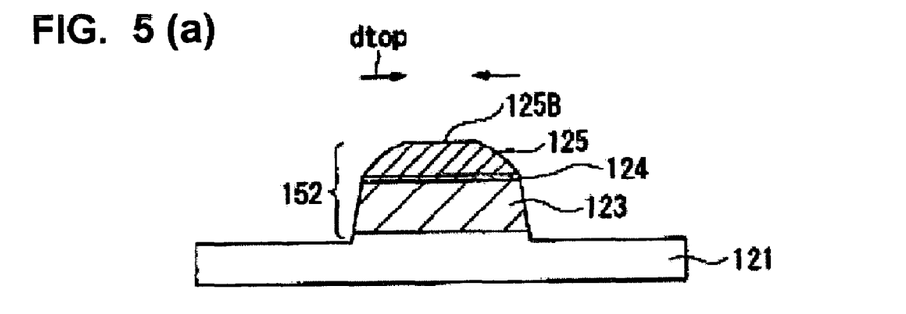
FIGS. 5(a)-(d) are cross-sectional views indicating the method for manufacturing a surface-emitting laser in accordance with the first embodiment of the present invention.

FIG. 5 (a) is a schematic cross-sectional view showing a fifth step of the present manufacturing method. In this step, the resist layer 130 remaining on the apex portion of the columnar section 152 is removed. For example, the resist layer 130 may be removed by a stripping liquid process or dry ashing. By this, the apex portion of the lens layer 125 becomes to be an apex portion 125B that defines a flat area with a diameter $d_{top}$. In other words, the lens layer 125 in a convex lens shape having the flat apex portion 125B at its apex is formed on the upper surface of the columnar section 152. Here, the apex portion 125B corresponds to the apex portion 115B in FIG. 1.

Sixth Step

FIG. 5 (b) is a schematic cross-sectional view showing a sixth step of the present manufacturing method. In this step, an oxidation constricting layer 128 is formed. For example, by conducting a water vapor processing at 400° C., an AlGaAs layer or the like is oxidized in a ring shape from the outer side of the columnar section 152. By this, a columnar section 153 having the oxidation constricting layer 128 in a ring shape is formed. The oxidation constricting layer 128 corresponds to the oxidation constricting film 118 in FIG. 1.

The diameter $d_{OX}$ of the oxidation constricting aperture of the oxidation constricting layer 128 may preferably be made greater than the diameter $d_{top}$ of the apex portion 125B of the lens layer 125. By so doing, the basic laser characteristics can be more securely made better, and the laser emission angle can be made smaller.

Seventh Step

FIG. 5 (c) is a schematic cross-sectional view showing a seventh step of the present manufacturing method. In this step, an embedding layer (dielectric layer) 127 is formed around a part of the lower DBR layer 121, the active layer, the upper DBR layer 123 and the contact layer 124. Concretely, a dielectric film is embedded around the columnar section 153 up to a height adjacent to the contact layer 124 in the columnar section 153, to thereby form the embedding layer 127. As the constituent material of the embedding layer 127, for example, polyimide or BCB may be used. For example, polyimide in a liquid state may be coated around the columnar section 153 by a droplet ejection method, and then the polyimide is hardened by sintering or the like. By this, the embedding layer 127 can be readily formed. By forming the embedding layer 127, an upper electrode 126 to be formed in a later step can be prevented from becoming short-circuited with undesired portions. Also, the embedding layer 127 planarizes the circumference of the columnar section 153, such that formation of the upper electrode 126 becomes easier. The embedding layer 127 corresponds to the embedding layer 117 in FIG. 1.

Eighth Step

FIG. 5 (d) is a schematic cross-sectional view showing an eighth step of the present manufacturing method. In this step, an upper electrode 126 that is in ohmic contact with the lens layer 125 is formed. Concretely, the upper electrode 126 is formed on the lens layer 125 in an area adjacent to its outer circumference and on the embedding layer 127. Here, the upper electrode 126 is brought in ohmic contact with the lens layer 125. The upper electrode 126 can be formed through, for example, forming an Au—Ge alloy film by a vacuum vapor deposition method, and patterning the alloy film by etching. The upper electrode 126 corresponds to the upper electrode 116 in FIG. 1.

After this step, a lower electrode (not shown) that is in ohmic contact with the lower DBR 121 is formed, whereby the surface-emitting laser 100 shown in FIG. 1 is completed. It is noted that the lower electrode can be formed in a manner similar to the upper electrode 126.

According to the above, in the present manufacturing method, etching is not conducted for the apex portion 125B of the lens layer 125, and therefore the designed film thickness defining the dimension of the lens layer 125 at the center axis can be maintained. Accordingly, the index of reflection at the center axis of the resonator, which is most important for the surface-emitting laser, can be readily set to a desired value. Therefore, according to the present manufacturing method, the surface-emitting laser 100 can be excellently and readily manufactured with a high degree of basic laser characteristics such as the threshold value, efficiency and the like.

Also, in accordance with the present manufacturing method, light emitted from portions of the resonator removed from its center axis can be refracted by the lens shaped portion of the lens layer 125. Therefore, in accordance with the present manufacturing method, the surface-emitting laser 100 that can provide a sufficient beam reshaping effect as a whole, and has a sufficiently small laser emission angle can be excellently and readily manufactured.

Also, in the present manufacturing method, the resist layer 130 is formed in a lens shape in the second step before the etching treatment to be conducted after the third step is conducted. By so doing, by the etching treatment conducted after the third step, the resist layer 130 and the epitaxial layers (semiconductor laminated body) 120 can be isotropically reduced.

By this, in the present manufacturing method, the center axis of the columnar section 151, 152 or 153 composing the resonator (optical axis of laser) and the optical axis of the lens shape of the lens layer 125 can coincide with each other in a self-alignment manner. Accordingly, by the present manufacturing method, a surface-emitting laser with high performance can readily be manufactured.

SECOND EMBODIMENT

Figure 6:
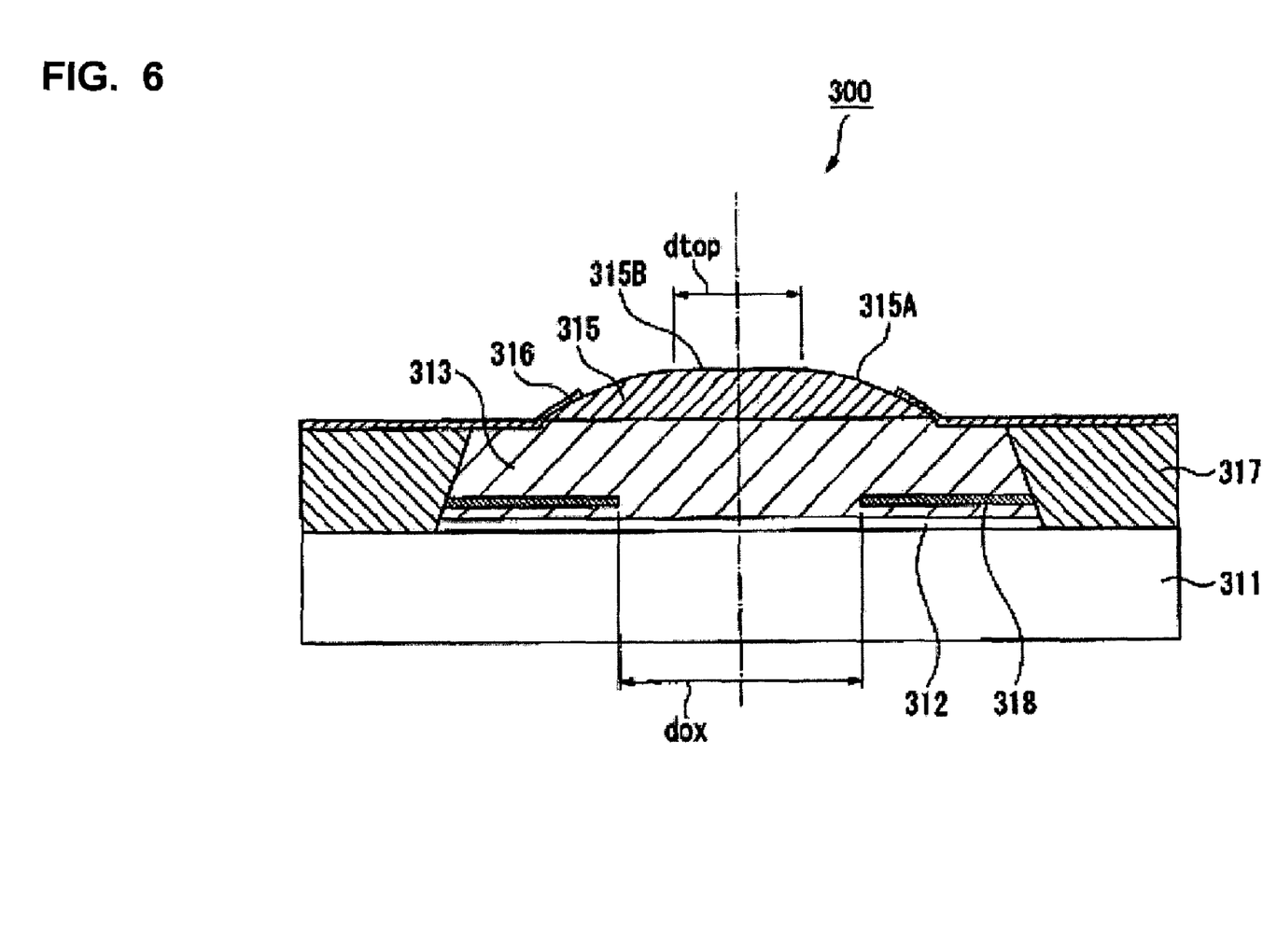
FIG. 6 is a schematic cross-sectional view of a surface-emitting laser in accordance with a second embodiment of the present invention.

FIG. 6 is a schematic cross-sectional view showing one example of a surface-emitting laser in accordance with a second embodiment of the present invention. A main difference between the surface-emitting laser 300 of the present embodiment and the surface-emitting laser 100 of the first embodiment is that a bottom surface of a convex lens shape of a lens layer 315 is smaller than an upper surface of an upper DBR 313. In other words, the bottom surface of the lens layer 315 is smaller than an upper surface of a resonator (composed of a lower DBR 311, an active layer 312 and the upper DBR 313). However, the shape of the lens layer 315 is similar to that of the lens layer 115 of the first embodiment, and includes a curved surface portion 315A defining a convex lens, and a flat apex portion 315B.

The surface-emitting laser 300 is formed from the lower DBR 311, the active layer 312, the upper DBR 313, the lens layer 315, an upper electrode 316, an embedding layer 317 and an oxidation constricting layer 318. Here, the lower DBR 311 can be formed in the same manner as the lower DBR 111. The active layer 312 can be formed in the same manner as the active layer 112. The upper DBR 313 can be formed in the same manner as the upper DBR 113. The upper electrode 316 can be formed in the same manner as the upper electrode 116. The embedding layer 317 can be formed in the same manner as the embedding layer 117.

According to the above, in the surface-emitting laser 300 in accordance with the present embodiment, the lens shaped portion defined by the lens layer 315 is provided on a portion of the upper surface of the upper DBR 313, such that the convex lens shape can be formed with a small curvature. Accordingly, the surface-emitting laser 300 can be provided with a smaller laser emission angle than that of the surface-emitting laser 100. Also, according to the surface-emitting laser 300, while its convex lens shape is provided with a small curvature, the lens layer 315 can be made thinner. Therefore, in accordance with the present embodiment, a surface-emitting laser with higher performance can be readily provided.

Next, a method for manufacturing the surface-emitting laser 300 having the structure described above is described with reference to FIG. 7 to FIG. 9.

First Step

Figure 7:
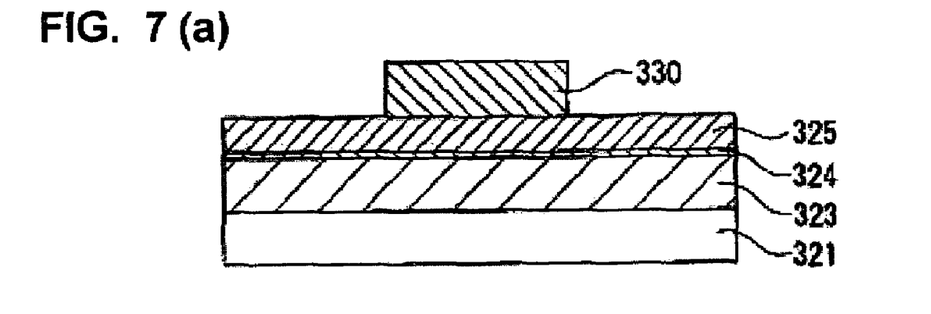
FIGS. 7(a)-7(d) are cross-sectional views indicating a method for manufacturing a surface-emitting laser in accordance with a second embodiment of the present invention.

FIG. 7 (a) is a schematic cross-sectional view showing a first step in the present manufacturing method. The present step is the same as the first step of the first embodiment shown in FIG. 4 (a). In other words, first, a lower DBR layer 321 is formed on, for example, an n-type GaAs substrate (not shown). The lower DBR layer 321 corresponds to the lower DBR 311 in FIG. 6. Next, on the lower DBR layer 321 is formed an active layer (not shown). The active layer is a source of the active layer 312 in FIG. 6. Further, on the active layer, an upper DBR layer 323 is formed. The upper DBR layer 323 is a source of the upper DBR 313 in FIG. 6. Then, a contact layer 324 is laminated on the upper DBR layer 323. This contact layer 324 may not be formed. Then, a lens layer 325 is formed on the contact layer 324. The lens layer 325 is a source of the lens layer 315 in FIG. 6. Then, a resist layer 330 having a predetermined pattern is formed on the lens layer 325.

Second Step

FIG. 7 (b) is a schematic cross-sectional view showing a second step in the present manufacturing method. The present step is the same as the second step of the first embodiment shown in FIG. 4 (b). More specifically, in the present step, the resist layer 330 is formed in a convex lens shape.

Third Step

FIG. 7 (c) is a schematic cross-sectional view showing a third step in the present manufacturing method. The present step is the same as the third step of the first embodiment shown in FIG. 4 (c). More specifically, in the present step, a columnar section 351 composed of the upper DBR layer 323, the contact layer 324 and the lens layer 325 is formed. The columnar section 351 defines a part of the resonator. It is noted that a part of the lower DBR 321 and the active layer may define a part of the columnar section 351. To form the columnar section 351, dry etching with a high selection ratio is conducted using a resist layer 330 in a convex lens shape as a mask.

Fourth Step

FIG. 7 (d) is a schematic cross-sectional view showing a fourth step in the present manufacturing method. In the present step, the resist layer 330 in a convex lens shape is isotropically reduced, as shown in FIG. 7 (d). Concretely, by using oxygen plasma or ozone, only the resist layer 330 is reduced in a similar shape. By this, the resist layer 330 becomes to have a convex lens shape having a center axis that coincides with the center axis of the columnar section 351 and having an outer diameter smaller than the outer diameter of the upper surface of the columnar section 351.

Fifth Step

Figure 8:
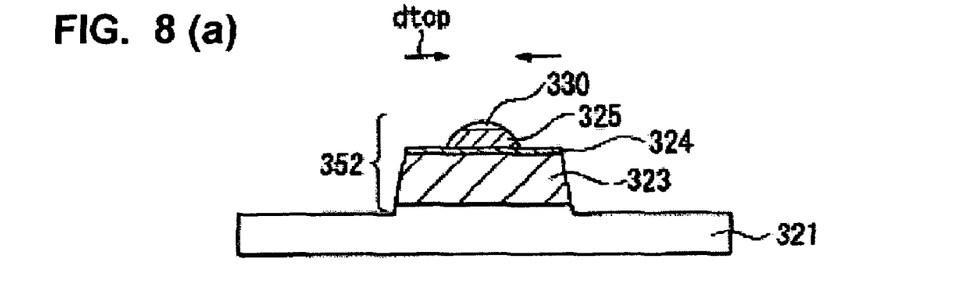
FIGS. 8(a)-8(d) are cross-sectional views indicating the method for manufacturing a surface-emitting laser in accordance with the second embodiment of the present invention.

FIG. 8 (a) is a schematic cross-sectional view showing a fifth step in the present manufacturing method. The present step may be conducted in a similar manner as that of the fourth step of the first embodiment shown in FIG. 4 (d). In other words, in the present step, the columnar section 351 and the resist layer 330 are isotropically reduced. Concretely, dry etching with a low selection ratio is conducted. By so doing, the columnar section 351 and the resist layer 330 are concurrently etched. By this, the lens shape of the resist layer 330 is formed in relief on the upper surface (one end portion) of the columnar section 351, whereby a columnar section 352 having a lens shape on its upper surface is formed.

The dry etching in the present step is conducted until the diameter (outer diameter) $d_{top}$ of the resist layer 330 becomes a predetermined value. For example, the diameter $d_{top}$ of the resist layer 330 may be successively measured, and the dry etching in the present step may be stopped when the diameter $d_{top}$ reaches the predetermined value. By so doing, the film thickness of the resist layer 330 can be readily and highly accurately controlled. Also, by controlling the film thickness of the resist layer 330 highly accurately, the diameter $d_{top}$ of a flat apex portion 325B to be formed in a later step can be highly accurately controlled.

Also, in the present step, according to the measured values of the diameter $d_{top}$ of the resist layer 330, the time for dry etching to be conducted thereafter may be adjusted. By so doing, the dry etching treatment of the present step can also be readily and highly accurately managed. The diameter $d_{top}$ of the resist layer 330 may preferably be as small as possible. Further, the diameter $d_{top}$ of the resist layer 330 may preferably be smaller than the diameter $d_{OX}$ of an oxidation constricting aperture of an oxidation constricting film 328 to be formed in a later step.

Sixth Step

FIG. 8 (b) is a schematic cross-sectional view showing a sixth step in the present manufacturing method. The present step may be conducted in a similar manner as that of the fifth step of the first embodiment shown in FIG. 5 (a). In other words, in the present step, the resist layer 330 remaining on the apex portion of the columnar section 352 is removed. For example, the resist layer 330 may be removed by a stripping liquid process or dry ashing. By this, the apex portion of the lens layer 325 becomes to be an apex portion 325B that defines a flat area with a diameter $d_{top}$. In other words, the lens layer 325 in a convex lens shape having the flat apex portion 325B at its apex is formed on the upper surface of the columnar section 352. Here, the apex portion 325B corresponds to the apex portion 315B in FIG. 6.

Seventh Step

FIG. 8 (c) is a schematic cross-sectional view showing a seventh step of the present manufacturing method. The present step may be conducted in a similar manner as the sixth step of the first embodiment shown in FIG. 5 (b). In other words, in this step, an oxidation constricting layer 328 is formed. For example, by conducting a water vapor processing at 400° C., an AlGaAs layer or the like is oxidized in a ring shape from the outer side of the columnar section 352. By this, a columnar section 353 having the oxidation constricting layer 328 in a ring shape is formed. The oxidation constricting layer 328 corresponds to the oxidation constricting film 318 in FIG. 6.

The diameter $d_{OX}$ of the oxidation constricting aperture of the oxidation constricting layer 328 may preferably be made greater than the diameter $d_{top}$ of the apex portion 325B of the lens layer 325. By so doing, the basic laser characteristics can be more securely made better, and the laser emission angle can be made smaller.

Eighth Step

FIG. 8 (d) is a schematic cross-sectional view showing an eighth step of the present manufacturing method. The present step may be conducted in a similar manner as the seventh step of the first embodiment shown in FIG. 5 (c). In other words, in the present step, an embedding layer (dielectric layer) 327 is formed around a part of the lower DBR layer 321, the active layer, the upper DBR layer 323 and the contact layer 324. The embedding layer 327 corresponds to the embedding layer 317 in FIG. 6.

Ninth Step

Figure 9:
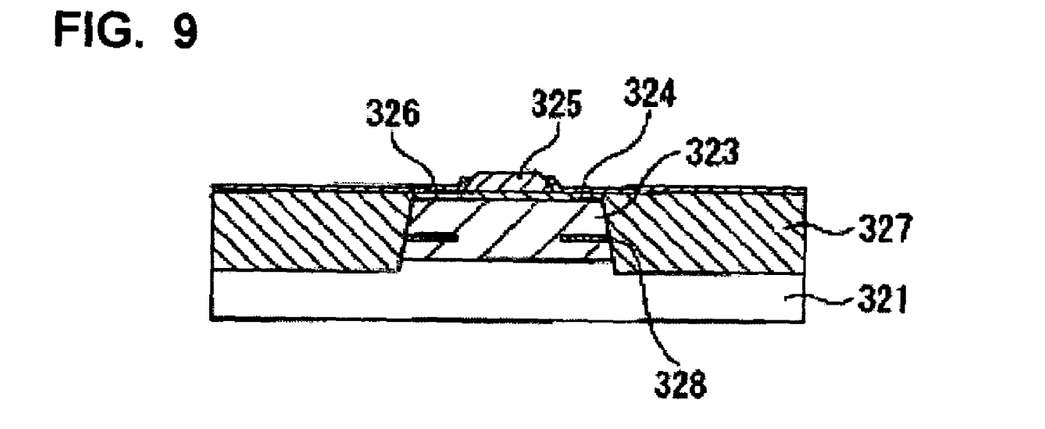
FIG. 9 is a cross-sectional view indicating the method for manufacturing a surface-emitting laser in accordance with the second embodiment of the present invention.

FIG. 9 is a schematic cross-sectional view showing a ninth step of the present manufacturing method. In present step, an upper electrode 326 that is in ohmic contact with the lens layer 325 is formed. Concretely, the upper electrode 326 is formed on the lens layer 325 in an area adjacent to its outer circumference, and around the lens layer 325 in a convex lens shape on the columnar section 353 in a plane surface (in other words, on the contact layer 324 formed in a ring shape around the lens layer 325). Here, the upper electrode 326 may be brought in ohmic contact not only with the lens layer 325 but also with the contact layer 324. Also, the upper electrode 326 is formed, extending over the upper surface of the embedding layer 327 formed around the columnar section 353. The upper electrode 326 can be formed through, for example, forming an Au—Ge alloy film by a vacuum vapor deposition method, and patterning the alloy film by etching.

After this step, a lower electrode (not shown) that is in ohmic contact with the lower DBR 321 is formed, whereby the surface-emitting laser 300 shown in FIG. 6 is completed. It is noted that the lower electrode can be formed in a manner similar to the upper electrode 326.

According to the above, in accordance with the present manufacturing method, in the sixth step, the lens layer 325 in a convex lens shape can be formed in a portion of the upper surface of the columnar section 352 composing the resonator of the surface-emitting laser. Accordingly, the lens layer 325 can be readily formed in a convex lens with a smaller curvature than before, the laser emission angle can be made sufficiently small by the lens layer 325, and the lens layer 325 can be made thinner than before.

Furthermore, according to the present manufacturing method, the upper electrode 326 that is an electrode in a ring shape is formed on the flat area of the columnar section 353, such that the upper electrode 326 and the lens layer 325 can be brought in good ohmic contact with each other. Also a contact area between the upper electrode 326 and the contact layer 324 can be made greater. Therefore, according to the present embodiment, the device resistance of the surface-emitting laser 300 can be readily reduced, and the surface-emitting laser 300 with high performance can be readily provided.

Electronic Apparatus

Examples of electronic apparatuses equipped with the surface-emitting laser of the embodiments described above are described.

The surface-emitting lasers of the present embodiments may be applied to optical fiber communications modules, optical interconnections that transmit and receive optical signals within an apparatus or a substrate, optical disk heads, laser printers, laser beam projectors, laser beam scanners, linear encoders, rotary encoders, displacement sensors, pressure sensors, gas sensors, liquid sensors, blood flow sensors, optical inter-couplers, parallel optical processors, and the like.

The technical scope of the present invention is not limited to the above-described embodiments, and various kinds of modifications can be made within the scope that does not deviate from the subject matter of the present invention. The concrete materials, layered structures, and the like enumerated in the embodiments are only part of examples and can be appropriately modified.

What is claimed is:

1. A surface-emitting laser comprising:
   a resonator;
   a lens layer in a convex lens shape having an apex portion that is flat disposed on one end portion of the resonator; and
   a current constricting layer that defines a flow area of a current that flows within the resonator, wherein the apex portion of the lens layer has a diameter smaller than a diameter of the flow area of the current constricting layer.

2. A surface-emitting laser according to claim 1, wherein the lens layer is formed from semiconductor.

3. A surface-emitting laser according to claim 1, wherein a bottom surface of the convex lens shape of the lens layer is smaller than an upper surface of the resonator.

4. A surface-emitting laser comprising:
   a resonator; and
   a lens layer in a convex lens shape having an apex portion that is flat disposed on one end portion of the resonator, wherein a bottom surface of the convex lens shape of the lens layer is smaller than an upper surface of the resonator.

5. A surface-emitting laser according to claim 4, wherein the lens layer is formed from semiconductor.

6. A surface-emitting laser according to claim 4, further comprising a current constricting layer that defines a flow area of a current that flows within the resonator, wherein the apex portion of the lens layer has a diameter smaller than a diameter of the flow area of the current constricting layer.

* * * * *

UNITED STATES PATENT AND TRADEMARK OFFICE
CERTIFICATE OF CORRECTION

PATENT NO. : 7,580,437 B2
APPLICATION NO. : 11/193727
DATED : August 25, 2009
INVENTOR(S) : Takayuki Kondo Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 895 days.

Signed and Sealed this

Fourteenth Day of September, 2010

David J. Kappos
*Director of the United States Patent and Trademark Office*